(12) United States Patent
Soda

(10) Patent No.: US 6,822,502 B2
(45) Date of Patent: Nov. 23, 2004

(54) VARIABLE IMPEDANCE CIRCUIT

(75) Inventor: Masaaki Soda, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/164,510

(22) Filed: Jun. 6, 2002

(65) Prior Publication Data

US 2002/0186066 A1 Dec. 12, 2002

(30) Foreign Application Priority Data

Jun. 7, 2001 (JP) ........................... 2001-171848

(51) Int. Cl.[7] ................................................ H03L 5/00
(52) U.S. Cl. ........................... 327/308; 327/334
(58) Field of Search ........................... 327/308, 334, 327/345, 77, 108, 112, 541, 543, 538, 403, 404, 427, 581; 326/30, 87

(56) References Cited

U.S. PATENT DOCUMENTS 5,194,765 A * 3/1993 Dunlop et al. ............. 326/87
5,254,883 A * 10/1993 Horowitz et al. ............. 326/30
5,506,541 A * 4/1996 Herndon ..................... 327/541
6,445,245 B1 * 9/2002 Schultz et al. .............. 327/541

FOREIGN PATENT DOCUMENTS

JP 2000-049583 2/2000

* cited by examiner

Primary Examiner—Long Nguyen
(74) Attorney, Agent, or Firm—Katten Muchin Zavis Rosenman

(57) ABSTRACT

A variable impedance circuit has an impedance block including a plurality of MOS transistors connected in parallel by switching and having impedances in accordance with powers of 2, the powers corresponding to the sequential orders of the MOS transistors arranged. A control unit controls ON or OFF of each of the MOS transistors to thereby select one of overall impedances of the MOS transistors. The step difference in the variable impedances is substantially a constant irrespective of the overall impedance selected.

10 Claims, 4 Drawing Sheets

FIG. 5A

| MOS | 0 | 1 | 2 | 3 | 4 | 5 | 6 | 7 | 8 | 9 | 10 |
|---|---|---|---|---|---|---|---|---|---|---|---|
| L(μm) | 8.24 | 7.94 | 7.48 | 7.04 | 6.62 | 6.2 | 5.8 | 5.42 | 5.04 | 4.68 | 4.34 |
| MOS | 11 | 12 | 13 | 14 | 15 | 16 | 17 | 18 | 19 | 20 | |
| L(μm) | 4 | 3.68 | 3.38 | 3.08 | 2.8 | 2.54 | 2.28 | 2.04 | 1.82 | 1.6 | |

FIG. 5B

| MOS | 0 | 1 | 2 | 3 | 4 | 5 | 6 | 7 | 8 | 9 | 10 |
|---|---|---|---|---|---|---|---|---|---|---|---|
| W(μm) | 171.4 | 5.04 | 5.34 | 5.68 | 6.04 | 6.46 | 6.9 | 7.38 | 7.94 | 8.54 | 9.24 |
| MOS | 11 | 12 | 13 | 14 | 15 | 16 | 17 | 18 | 19 | 20 | |
| W(μm) | 10 | 10.86 | 11.86 | 12.98 | 14.28 | 15.78 | 17.54 | 19.6 | 22.06 | 25 | |

VARIABLE IMPEDANCE CIRCUIT

BACKGROUND OF THE INVENTION (a) Field of the Invention

The present invention relates to a variable impedance circuit and, more particularly, to a variable impedance circuit having a plurality of impedance elements switched for connection between external terminals.

(b) Description of the Related Art

In an I/O circuit used for input/output of data in an LSI, the input impedance of the I/O circuit should be matched with the impedance of the transmission line transferring the data to/from the I/O circuit. Although the impedance matching scheme generally uses MOS transistors or resistors, there is a problem in that the resistances of the MOS transistors or resistors deviate from the design resistances due to characteristic variances associated therewith. Thus, a variable resistance circuit having an adjustment means for the impedance is used as the I/O circuit.

JP-A-2000-49583, for example, describes a variable resistance circuit, such as shown in FIG. 1, used for the impedance adjustment. The variable resistance circuit includes an impedance block 20 including a plurality of MOS transistors having different gate widths, a comparator 21 and a control unit 22.

The impedance block 20 has a basic structure wherein a plurality of MOS transistors are connected in parallel, and the gates of the MOS transistors are connected to outputs of AND gates, each of which has inputs connected to a signal line 15 and a corresponding control line 14. The signal line 15 is common to the AND gates, and the control lines 14 are connected to the control unit 22.

Each of the MOS transistors receiving the outputs of AND gates, which are connected to the control lines 14 assuming a high level, assumes ON- or OFF-state depending on the level of the signal line 15, thereby providing a signal current. On the other hand, the MOS transistors receiving the outputs of AND gates, which are connected to the control lines 14 assuming a low level, assumes an OFF-state.

The MOS transistor has a resistance in inverse proportion to the gate width (W) of the MOS transistor in a linear resistance region thereof, wherein the ON-current of the MOS transistor changes in proportion to the applied voltage. The ON-resistance $r_{ON}$ of the MOS transistor is expressed by $1/g_m$, wherein the transconductance $g_m$ is in proportion to W/L, given L being the gate length of the MOS transistor. This fact allows the overall resistance of the MOS transistors to be changed by changing the total gate width of the MOS transistors which are ON.

In the configuration shown in FIG. 1, the MOS transistors have gate widths of 1W, 2W, 4W and 8W in accordance with powers of 2, the powers corresponding to the sequential order of the MOS transistors, i.e., "0" to "3" in this example. Thus, the overall resistance Z is expressed by the following formula:

$$Z=Z_0/(S_0\times1+S_1\times2+S_2\times4+S_3\times8),$$

wherein $Z_0$ represents a unit resistance corresponding to the unit gate width "W", and $S_i$ (i=0, 1, 2, 3) represents "1" for the MOS transistor which is ON and "0" for the MOS transistor which is OFF. Thus, it is possible to select one of the specified overall resistances by controlling the levels of the control lines 14 at "1" or "0". More specifically, Z can assume a resistance between $Z_0$ and $Z_0/15$.

In the conventional variable resistance circuit as described above, the overall resistance Z follows a hyperbola such as shown in FIG. 2, wherein the resistance Z obtained in the circuit is plotted against the code in decimal notation (code value), which defines the respective levels of the control lines 14. This fact may degrade the accuracy of the resistance obtained therein as will be detailed hereinafter.

For example, comparing the case where the resistance assumes the maximum (i.e., $S_0$=1, and $S_1$=$S_2$=$S_3$=0) and the case where the resistance assumes a value next to the maximum (i.e., $S_1$=1 and $S_0$=$S_2$=$S_3$, the step difference between the maximum and next to the maximum is as follows:

$$Z_0-Z_0/2=Z_0/2 \qquad (1).$$

On the other hand, comparing the case where the resistance assumes a minimum (i.e., $S_0$=$S_1$=$S_2$=$S_3$=1) and the case wherein the resistance assumes a value next to the minimum (i.e., $S_0$=0, and $S_1$=$S_2$=$S_3$=1), the step difference between the minimum and next to the minimum is as follows:

$$Z_0/14-Z_0/15=Z_0/210 \qquad (2).$$

It will be understood that the former step difference is extremely larger than the latter step difference.

Since the step difference is extremely larger in the region of a larger overall resistance in the conventional technique, as described above, the overall resistance actually obtained by controlling the levels of the control lines may fall outside the objective resistance range in the region of the larger overall resistance. In such a case, degradation of the signal wave may occur in the I/O circuit due to the mismatching of the impedance.

SUMMARY OF THE INVENTION

In view of the above problem in the conventional technique, it is an object of the present invention to provide a variable impedance circuit which is capable of achieving an overall impedance more likely to fall within an objective impedance range, with less variances in the resultant overall resistance.

The present invention provides, in a first aspect thereof, a variable impedance circuit including: a pair of external terminals; an impedance block including first through n-th impedance elements; and a control section for switching each of the impedance elements for connection between the pair of external terminals, thereby selecting one of overall impedances of the first through n-th impedance elements and allowing the selected one of the overall impedances to appear across the pair of external terminals, the overall impedances having therebetween a substantially constant step difference.

The present invention also provides, in a second aspect thereof, a variable impedance circuit including: a pair of external terminals; an impedance block including first through n-th impedance elements; and a control section for switching each of the impedance elements for connection between the pair of external terminals, thereby selecting one of overall impedances of the first through n-th impedance elements and allowing the selected one of the overall impedances to appear across the pair of external terminals, the overall impedances having a step difference profile which follows a linear function of "i", given "i" being a sequential number of each of the first through n-th transistors.

In accordance with the variable impedance circuits of the present invention, the specified step difference or the specified step difference profile allows the variable impedance circuit to have an accurate design impedance even in the case of characteristic variances of the impedance elements.

The above and other objects, features and advantages of the present invention will be more apparent from the following description, referring to the accompanying drawings.

BRIEF DESCRIPTION OF THE DRAWINGS

FIG. 5A is a table tabulating the gate lengths of the MOS transistors in the impedance block, with the gate width maintained constant, for achieving the impedance profile of FIG. 4, and FIG. 5B is a table tabulating the gate widths of the MOS transistors in the impedance block, with the gate length maintained constant, for achieving the impedance profile of FIG. 4.

PREFERRED EMBODIMENTS OF THE INVENTION

Figure 1:
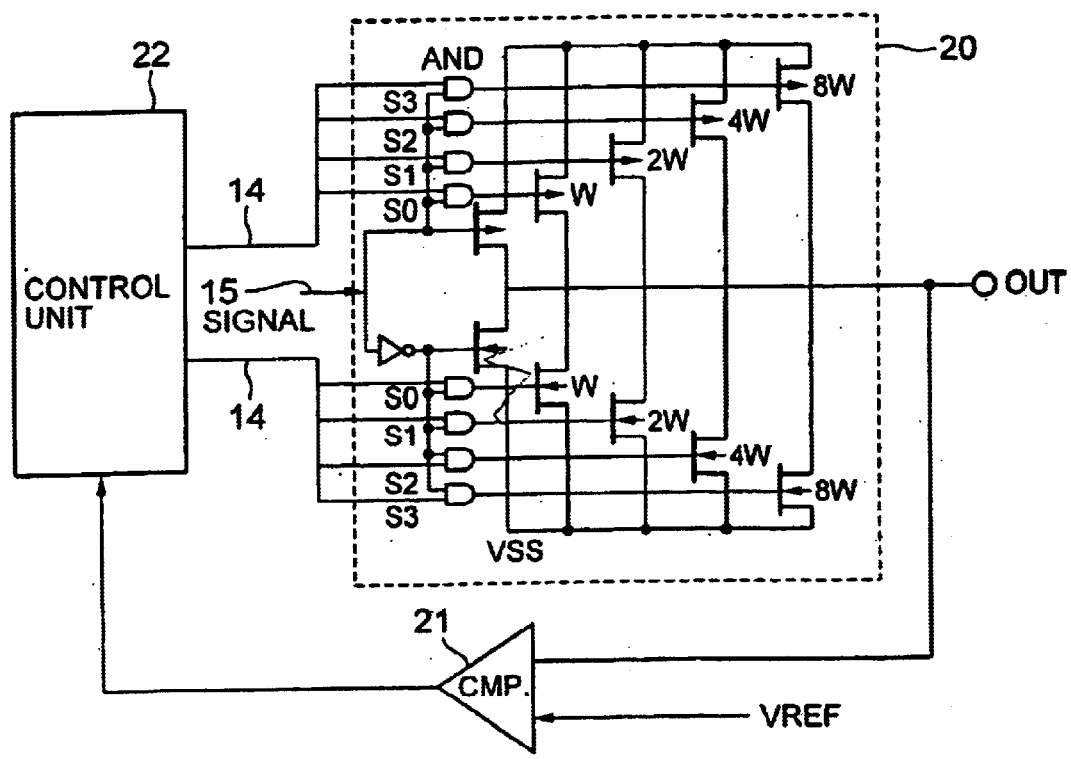
FIG. 1 is a circuit diagram of a conventional variable impedance circuit.
Figure 2:
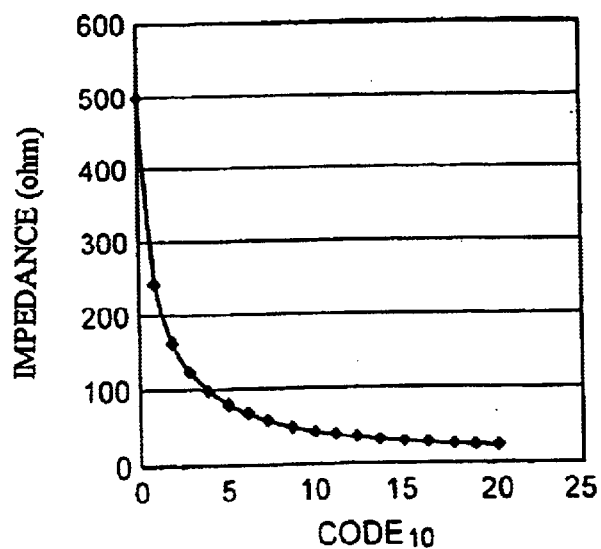
FIG. 2 is a graph showing the impedance profile obtained by the variable impedance circuit of FIG. 1.

Now, the present invention is more specifically described with reference to accompanying drawings, wherein similar constituent elements are designated by similar reference numerals.

Figure 3:
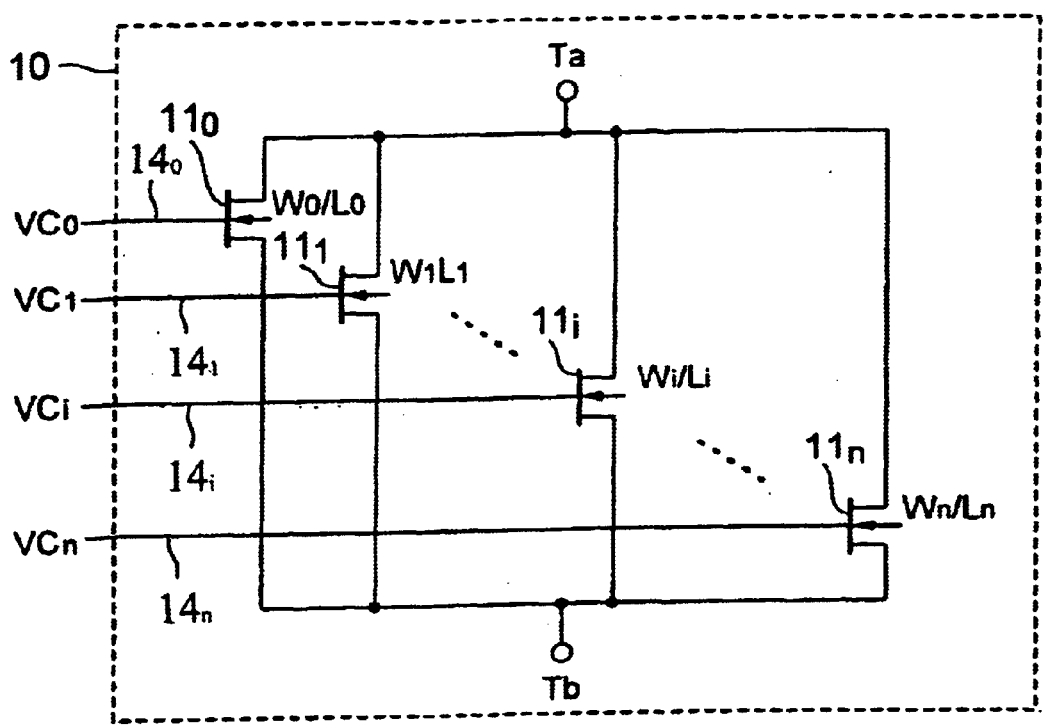
FIG. 3 is an impedance block of a variable impedance circuit according to an embodiment of the present invention.

Referring to FIG. 3, an impedance block, generally designated by numeral 10, is used in a variable impedance circuit according to an embodiment of the present invention. The other configuration of the variable impedance circuit may be such as described with reference to FIG. 1.

The impedance block 10 includes a plurality of (n+1) MOS transistors $11_0$ to $11_n$, n being an integer greater than 2, connected in parallel between a first external terminal Ta and a second external terminal Tb. The gates of MOS transistors $11_0$ to $11_n$ are connected to control lines $14_0$ to $14_n$, respectively, which receive respective control signals $VC_0$ to $VC_n$. The MOS transistors $11_0$ to $11_n$ have specific ratios $W_0/L_0$ to $W_n/L_n$, respectively, so that the step differences between the overall resistance of 0-th (zero-th) to i-th transistors and the overall resistance of 0-th to (i+1)-th transistors are substantially constant or at least reside within a specified range, with the "i"s being integers between "1" to "n" inclusive of both. Given W and L represent the gate width and the gate length, respectively, of the specified MOS transistor, which is specified by the sequential numbers "0" to "n" each used as a suffix, the term "overall resistance" as used herein means the resistance obtained between the first external terminal Ta and the second external terminal Tb when the 0-th to i-th transistors or 0-th to (i+1)-th transistors are ON.

The specific ratios $W_0/L_0$ to $W_n/L_n$ may be preferably obtained by selecting different gate lengths $L_0$ to $L_n$ with the gate widths $W_0$ to $W_n$ being maintained constant, or may be preferably obtained by selecting different gate widths $W_0$ to $W_n$ with the gate length $L_0$ to $L_n$ being maintained constant. In addition, both the gate lengths and the gate widths may be respectively different among some of the (n+1) MOS transistors.

The i-th MOS transistor (i=0, 1, . . . or n) provides a specified ON-resistance by applying thereto a high level voltage through the corresponding control line $VC_i$.

Now, the ON-resistance of the i-th MOS transistor $11_i$ is considered for obtaining a specific value for the step difference ($dR_i$) between the overall resistance ($R_{i-1}$) obtained by applying a high level voltage to the control lines $VC_0$ to $VC_{i-1}$ and the overall resistance ($R_i$) obtained by applying a high level voltage to the control lines $VC_0$ to $VC_i$.

From the general formula of the parallel connection, the ON-resistance $r_i$ of the i-th MOS transistor $11_i$ is determined so as to satisfy the following relationship:

$$r_i = R_{i-1} \times ((R_{i-1}/dR_i) - 1) \quad (3).$$

The ON-resistance $r_i$ of the i-th MOS transistor is adjusted by selecting a specified gate length and/or a specified gate width for each of i's.

Figure 4:
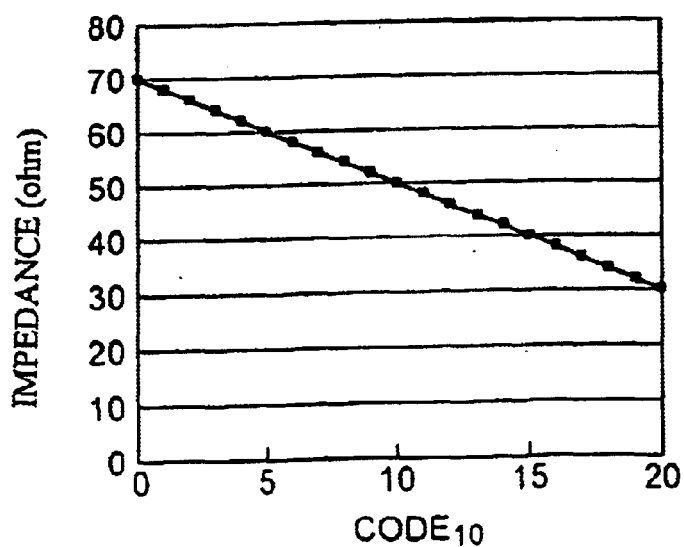
FIG. 4 is a graph showing an example of the desired impedance profile to be achieved by the variable impedance circuit of the embodiment.

Referring to FIG. 4, the graph shows an example of the desired linear relationship between the overall impedance and the code in decimal notation input through the control lines. This relationship can be achieved by using a MOS transistor block including MOS transistors having different gate lengths and a constant gate width of, for example, 10 micrometers.

Referring to FIG. 5A, the table shows the different gate lengths in micrometers employed for the respective MOS transistors $11_0$ to $11_n$ in the MOS transistor block 10 achieving the linear relationship shown in FIG. 4. These gate lengths are obtained as follows.

In general, the resistance of MOS transistor is in proportion to the gate length, if only the gate length is changed with the gate width being maintained at a constant. Thus, the respective resistances of the zeroth to twentieth MOS transistors in the MOS transistor block are first determined by using the formula (3) under the condition of a constant step difference dR(=2 ohms) shown in FIG. 4. Thereafter, the gate lengths of the respective MOS transistors are determined as shown in FIG. 5A based on the respective resistances of the MOS transistors, whereby the MOS transistor block achieving the constant step difference dR can be obtained.

The relationship shown in FIG. 4 can be also achieved by using a MOS transistor block including MOS transistors having different gate widths and a constant gate length of, for example, 4 micrometers. Referring to FIG. 5B, the table shows the different gate widths in micrometers employed for the respective MOS transistors $11_0$ to $11_n$ in the MOS transistor block 10.

In general, the ON-resistance of MOS transistor is inverse proportion to the gate width, if only the gate width is changed with the gate length being maintained at a constant. Thus, the respective resistances of the zeroth to twentieth MOS transistors in the MOS transistor block are first determined by using the formula (1) under the condition of a constant step difference dR shown in FIG. 4. Thereafter, the gate widths of the respective MOS transistors are determined as shown in FIG. 5A based on the respective resistances of the MOS transistors, whereby the MOS transistor block achieving the constant step difference dR can be obtained.

It is to be noted, however, that a larger gate length employed for achieving a higher resistance may cause a lower operational speed of the MOS transistor. This can be avoided by using a smaller gate width instead of the larger gate length, which is larger than a design maximum gate length. On the other hand, a larger gate width for achieving a lower resistance of the MOS transistor is difficult to employ because of the restriction of the space for the MOS transistor. In this case, the lower resistance can be achieved by using a smaller gate length instead of the larger gate width, which is larger than the design maximum gate width. Thus, the linear relationship of FIG. 4 may be achieved without causing degradation in the transistor characteristic and involving a large transistor area, by using the different gate lengths and the different gate widths both residing within suitable ranges.

Figure 6:
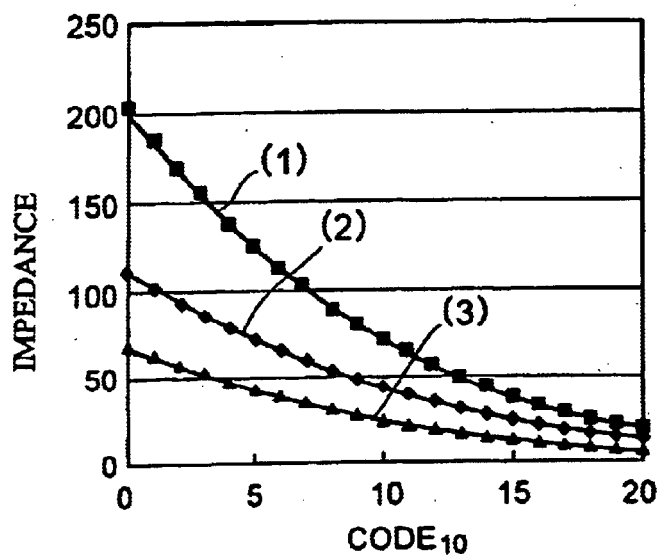
FIG. 6 is a graph showing another example of the desired impedance profile.

The linear relationship of FIG. 4 may be replaced by other relationships such as shown in FIG. 6, wherein the step difference $dR_i$ changes in accordance with a linear function of "i".

More specifically, the step difference $dR_i$ may be represented by the following relationship:

$$dR_i = Rd_0 - i/Rd,$$

wherein $Rd_0$ and $Rd$ represents the ON-resistance of MOS transistor $11_0$ and a constant, respectively, and satisfy the relationship $Rd_0 > n/Rd$. In this configuration, the step difference $dR_i$ is relatively large for the "i" having a smaller value and is relatively small for the "i" having a larger value. The MOS transistor block having such step differences $dR_i$ achieves an advantage that the step difference in the vicinity of the target impedance is less affected by the characteristic variances of the MOS transistors due to the "i" residing substantially at the midst of the range for the code values, i.e., due to the relatively larger "i". In FIG. 6, the profiles (1), (2) and (3) correspond to the cases of higher overall resistance, standard (medium) overall resistance and lower overall resistance, respectively, for the desired profile.

For example, it is assumed that the standard profile denoted by (2) in FIG. 6 corresponds to the desired overall resistance profile, wherein the step difference is 2 ohms in the vicinity of the target overall resistance of 50 ohms. It is also assumed that one of the MOS transistors in the MOS transistor block has a lower transconductance $g_m$ due to the characteristic variance among the MOS transistors. In such a case, the one of the MOS transistors has a higher resistance and involves a higher step difference than the design step difference with respect to the preceding-order MOS transistor.

Since the target impedance of 50 ohms resides in the range of the "i" having a relatively higher value in the graph (2), and thus the design step difference is lower in the vicinity of the target resistance in the relationship (4), the variance of the step difference can be suppressed for the case of the MOS transistor having the higher resistance. That is, the actual step difference may reside around the design step difference of 2 ohms.

Conversely, it is also assumed that one of the MOS transistors has a higher transconductance $g_m$. In this case, the step difference of the one of the MOS transistors with respect to the preceding-order MOS transistor becomes lower. However, since the target transistor of 50 ohms resides in the range of the "i" having a relatively lower value in the graph (2), and thus the design step difference is higher in the vicinity of the target resistance in the relationship (4), the variance of the step difference can be suppressed for the case of the MOS transistor having the lower resistance. That is, the actual step difference may reside around the design step difference of 2 ohms.

By using the resistance profile shown in FIG. 6, the variances of the transistor characteristic do not significantly affect or change the design step difference in the overall impedance profile in the vicinity of the target impedance. This allows the MOS transistor block to have a smaller number of MOS transistors compared to the case of the linear resistance profile shown in FIG. 4, without degrading the accuracy and the circuit characteristic.

Figure 7:
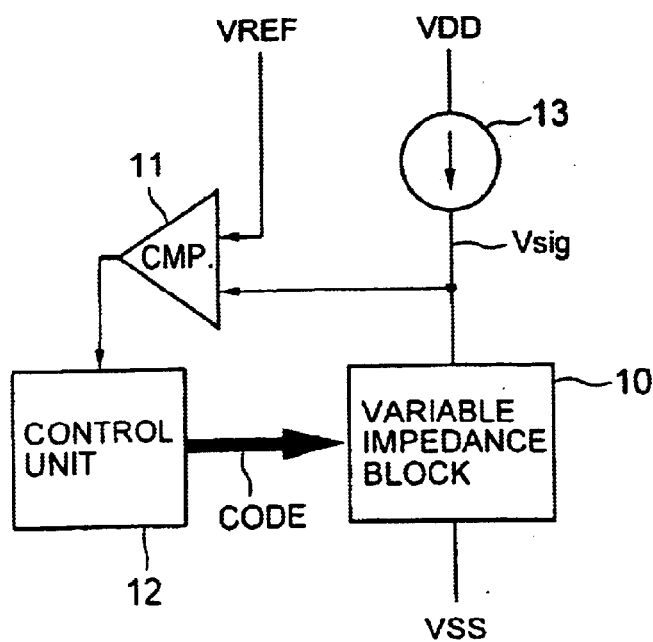
FIG. 7 is a block diagram of a variable impedance circuit according to an embodiment and having an impedance block such as shown in FIG. 3.

Referring to FIG. 7, a variable impedance circuit according to an embodiment of the present invention has the MOS transistor block 10 shown in FIG. 1, a control unit 12, a comparator 11, and a constant current source 13. The constant current source 13 generates a voltage signal Vsig which is in proportion to the impedance provided by the variable impedance circuit 10. The comparator 11 compares the voltage signal Vsig against the reference voltage $V_{REF}$ to output the result signal representing the result of the comparison. The control unit 12 receives the result signal to output a code signal "code" for controlling the MOS transistors in the MOS transistor block 10 by using a feedback loop, thereby allowing the voltage signal Vsig to coincide with the reference voltage $V_{REF}$.

In the above control scheme, the overall impedance Z of the MOS transistor block 10 is expressed by:

$$Z = V_{REF}/I_0,$$

wherein $I_0$ represents the constant current provided by the constant current source 13.

By the configurations of FIG. 7, the variable impedance circuit has an accurate impedance by the function of the control unit 12 controlling the overall impedance within a specified level irrespective of characteristic variances of the MOS transistors, ambient temperature, voltage of the voltage source.

Since the above embodiments are described only for examples, the present invention is not limited to the above embodiments and various modifications or alterations can be easily made therefrom by those skilled in the art without departing from the scope of the present invention. For example, the variable resistance circuit in the above embodiment may be a general variable impedance circuit including a variable capacitance circuit, wherein the gate capacitances of the MOS transistors are connected in parallel, for example.

What is claimed is:

1. A variable impedance circuit comprising:
   a pair of external terminals;
   an impedance block including first through n-th impedance elements, n being an integer greater than 2; and
   a control section for switching each of said impedance elements for connection between said pair of external terminals, thereby selecting one of overall impedances of said first through n-th impedance elements and allowing said selected one of said overall impedances to appear across said pair of external terminals, said overall impedances having therebetween a substantially constant step difference, wherein:
   said impedance elements are first through n-th MOS transistors; and
   said step difference is a difference between an (i−1)-th overall resistance obtained by connecting said first through (i−1)-th MOS transistors in parallel and an i-th overall resistance obtained by connecting said first through i-th MOS, transistors in parallel, given "i" representing i=1 to n inclusive of both.

2. The variable impedance circuit as defined in claim 1, wherein said first through n-th MOS transistors have different gate widths and different gate lengths.

3. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having therebetween a substantially constant step difference wherein:

said impedance elements are first through n-th MOS transistors; and said step difference is a difference between an (i–1)-th overall resistance obtained by connecting said first through (i–1)-th MOS transistors in parallel and an i-th overall resistance obtained by connecting said first through i-th MOS transistors in parallel, given "i" representing i=1 to n inclusive of both, and wherein said first through n-th MOS transistors have different gate lengths and a constant gate width.

4. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having therebetween a substantially constant step difference wherein:

said impedance elements are first through n-th MOS transistors; and said step difference is a difference between an (i–1)-th overall resistance obtained by connecting said first through (i–1)-th MOS transistors in parallel and an i-th overall resistance obtained by connecting said first through i-th MOS transistors in parallel, given "i" representing i=1 to n inclusive of both, and wherein said first through n-th MOS transistors have different gate widths and a constant gate length.

5. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having therebetween a substantially constant step difference wherein:

said impedance elements are first through n-th MOS transistors; and said step difference is a difference between an (i–1)-th overall resistance obtained by connecting said first through (i–1)-th MOS transistors in parallel and an i-th overall resistance obtained by connecting said first through i-th MOS transistors in parallel, given "i" representing i=1 to n inclusive of both, and wherein some of said first through n-th MOS transistors have a first predetermined gate width and different gate lengths, or some of said first through n-th MOS transistors have a second predetermined gate length and different gate widths.

6. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having a step difference profile which follows a linear function of "i", given "i" being a sequential number of each of said first through n-th impedance elements, wherein said impedance elements are first through n-th MOS transistors, and wherein said first through n-th MOS transistors have different gate lengths and a constant gate width.

7. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having a step difference profile which follows a linear function of "i", given "i" being a sequential number of each of said first through n-th impedance elements, wherein said impedance elements are first through n-th MOS transistors, and wherein said first through n-th MOS transistors have different gate widths and a constant gate length.

8. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having a step difference profile which follows a linear function of "i", given "i" being a sequential number of each of said first through n-th impedance elements, wherein said impedance elements are first through n-th MOS transistors, and wherein some of said first through n-th MOS transistors have a first predetermined gate width and different gate lengths, or some of said first through n-th MOS transistors have a second predetermined gate length and different gate widths.

9. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having therebetween a substantially constant step difference, wherein:

said impedance elements are first through n-th MOS transistors; and said step difference is a difference between an (i−1)-th overall resistance obtained by connecting said first through (i−1)-th MOS transistors in parallel and an i-th overall resistance obtained by connecting said first through i-th MOS transistors in parallel, given "i" representing i=1 to n inclusive of both, and wherein some of said first through n-th MOS transistors have a first predetermined gate width and different gate lengths, and some of said first through n-th MOS transistors have a second predetermined gate length and different gate widths.

10. A variable impedance circuit comprising:

a pair of external terminals;

an impedance block including first through n-th impedance elements, n being an integer greater than 2; and a control section for switching each of said impedance elements for connection between said pair of external terminals, thereby selecting one of overall impedances of said first through n-th impedance elements and allowing said selected one of said overall impedances to appear across said pair of external terminals, said overall impedances having a step difference profile which follows a linear function of "i", given "i" being a sequential number of each of said first through n-th impedance elements, wherein said impedance elements are first through n-th MOS transistors, and wherein some of said first through n-th MOS transistors have a first predetermined gate width and different gate lengths, and some of said first through n-th MOS transistors have a second predetermined gate length and different gate widths.

\* \* \* \* \*